(12) United States Patent
Kim et al.

(10) Patent No.: US 12,418,998 B2
(45) Date of Patent: Sep. 16, 2025

(54) DISPLAY APPARATUS

(71) Applicant: SAMSUNG ELECTRONICS CO., LTD., Suwon-si (KR)

(72) Inventors: Dowan Kim, Suwon-si (KR); Kiwoong Kim, Suwon-si (KR); Yoonah Kim, Suwon-si (KR); Chiun Park, Suwon-si (KR); Kwangsung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 18/143,933

(22) Filed: May 5, 2023

(65) Prior Publication Data
US 2024/0032217 A1    Jan. 25, 2024

Related U.S. Application Data

(63) Continuation of application No. PCT/KR2023/005195, filed on Apr. 18, 2023.

(30) Foreign Application Priority Data

Jul. 20, 2022 (KR) .......... 10-2022-0089886
Sep. 2, 2022 (KR) .......... 10-2022-0111740

(51) Int. Cl.
*H05K 5/02* (2006.01)
*H01L 25/075* (2006.01)
*H05K 5/30* (2025.01)

(52) U.S. Cl.
CPC ....... *H05K 5/0217* (2013.01); *H01L 25/0753* (2013.01); *H05K 5/30* (2025.01)

(58) Field of Classification Search
CPC .......................... H05K 5/0017; H05K 5/0217
USPC .......................................................... 361/807
See application file for complete search history.

(56) References Cited

U.S. PATENT DOCUMENTS

| | | | |
|---|---|---|---|
| 7,441,847 B2 | 10/2008 | Francisquini | |
| 9,863,586 B2 | 1/2018 | Yang et al. | |
| 10,330,979 B2 | 6/2019 | Ryu et al. | |
| 10,691,395 B2 | 6/2020 | Hyeon | |
| 10,803,786 B2 | 10/2020 | Yoon et al. | |

(Continued)

FOREIGN PATENT DOCUMENTS

| | | |
|---|---|---|
| CN | 103544897 A | 1/2014 |
| CN | 113643623 A | 11/2021 |

(Continued)

OTHER PUBLICATIONS

International Search Report (PCT/ISA/210) dated Jul. 31, 2023, issued by International Searching Authority for International Application No. PCT/KR2023/005195.

(Continued)

*Primary Examiner* — Hung S. Bui
(74) *Attorney, Agent, or Firm* — Sughrue Mion, PLLC

(57) ABSTRACT

A display apparatus includes: a display module including a substrate on which a plurality of light emitting diodes (LEDs) are mounted; a cabinet provided to support the display module; and a circuit case attached to the cabinet. The display module is provided to be detachable from and mountable on a front side of the cabinet, and the display module is provided to be detachable from and mountable on a rear side of the cabinet.

12 Claims, 13 Drawing Sheets

(56) References Cited

U.S. PATENT DOCUMENTS

| | | | |
|---|---|---|---|
| 10,943,890 B2 | 3/2021 | Ryu et al. | |
| 11,122,695 B2 | 9/2021 | Yi et al. | |
| 11,856,716 B2* | 12/2023 | Jiang | H05K 5/0221 |
| 11,917,770 B2* | 2/2024 | Kim | G09F 9/302 |
| 2011/0216485 A1* | 9/2011 | Kang | H04M 1/7246 |
| | | | 361/679.01 |
| 2020/0296318 A1 | 9/2020 | Dai et al. | |
| 2020/0347985 A1 | 11/2020 | Dai et al. | |
| 2020/0357311 A1 | 11/2020 | Yoon et al. | |

FOREIGN PATENT DOCUMENTS

| | | |
|---|---|---|
| JP | 2004-152788 A | 5/2004 |
| JP | 2019-215553 A | 12/2019 |
| KR | 10-2005-0016516 A | 2/2005 |
| KR | 10-0942914 B1 | 2/2010 |
| KR | 10-1541398 B1 | 8/2015 |
| KR | 10-1705510 B1 | 2/2017 |
| KR | 10-1712620 B1 | 3/2017 |
| KR | 10-1821151 B1 | 1/2018 |
| KR | 10-1917075 B1 | 11/2018 |
| KR | 10-2019-0083562 A | 7/2019 |
| KR | 10-2018793 B1 | 9/2019 |
| KR | 10-2009663 B1 | 10/2019 |
| KR | 10-2021-0015488 A | 2/2021 |
| KR | 10-2270484 B1 | 6/2021 |
| KR | 10-2407475 B1 | 6/2022 |

OTHER PUBLICATIONS

Written Opinion (PCT/ISA/237) dated Jul. 31, 2023, issued by International Searching Authority for International Application No. PCT/KR2023/005195.

Communication dated May 9, 2025 issued by the European Patent Office in European Patent Application No. 23843124.1.

* cited by examiner

DISPLAY APPARATUS

CROSS-REFERENCE TO RELATED APPLICATIONS

This application is a by-pass continuation application of International Application No. PCT/KR2023/005195, filed on Apr. 18, 2023, which is based on and claims priority to Korean Patent Application Nos. 10-2022-0089886, filed on Jul. 20, 2022, and 10-2022-0111740, filed on Sep. 2, 2022, in the Korean Intellectual Property Office, the disclosures of which are incorporated by reference herein their entireties.

BACKGROUND

1. Field

The disclosure relates to a display apparatus including a plurality of display modules and a cabinet supporting a plurality of display modules.

2. Description of Related Art

A display apparatus converts acquired or stored electrical information into visual information and displays the converted information to a user.

In order to implement a large-sized screen, the display apparatus may include a plurality of display modules and a cabinet supporting the plurality of display modules that are consecutively tiled in an upper to lower direction and a left to right direction. The cabinet supporting the plurality of display modules may be provided in plural, and the plurality of cabinets may also be provided to be consecutively tiled in an upper to lower direction and a left to right direction similar to the plurality of display modules. The plurality of display modules supported by the plurality of cabinets may form a single large screen.

A circuit case of a display apparatus may need to be detachable from a cabinet, thus the circuit case may need to be accessed from the front and rear of the display apparatus.

SUMMARY

One aspect of the disclosure provides a display apparatus in which a circuit case is detachable from a cabinet by accessing the circuit case from the front and rear of the display apparatus.

According to an aspect of the disclosure, a display apparatus includes: a display module including a substrate on which a plurality of light emitting diodes (LEDs) are mounted; a cabinet provided to support the display module; and a circuit case attached to the cabinet. The circuit case is provided to be detachable from and mountable on a front side of the cabinet, and the circuit case is provided to be detachable from and mountable on a rear side of the cabinet.

According to an aspect of the disclosure, a display apparatus in which a circuit case is detachable from a cabinet by accessing the circuit case from the front and rear of the display apparatus can be provided.

BRIEF DESCRIPTION OF THE DRAWINGS

The above and other aspects, features, and advantages of certain embodiments of the disclosure will be more apparent from the following description taken in conjunction with the accompanying drawings, in which.

MODES OF THE DISCLOSURE

Figure 1:
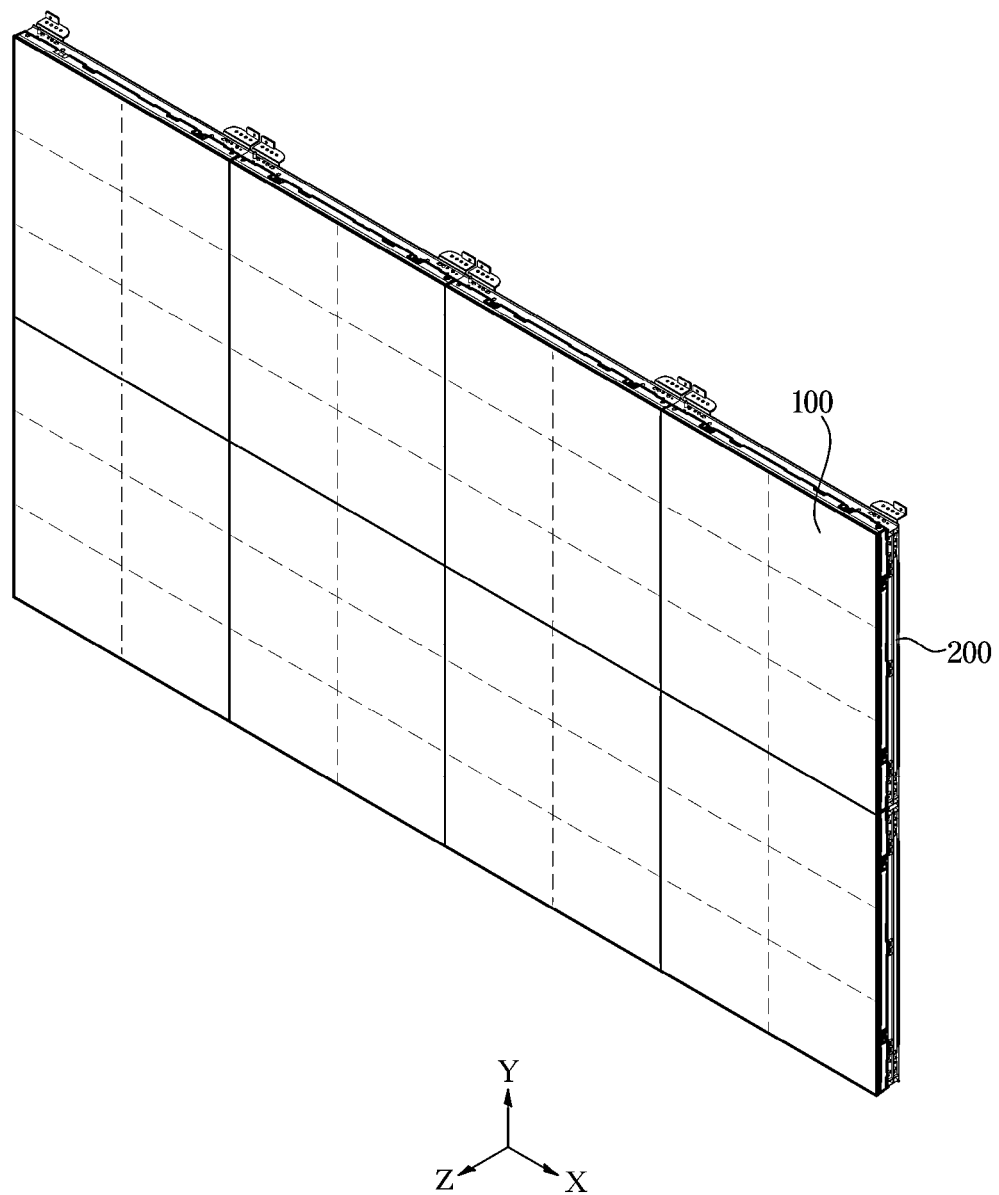
FIG. 1 is a view illustrating a display apparatus according to an embodiment.

Embodiments described in the specification and configurations shown in the accompanying drawings are merely examples of the disclosure, and various modifications may replace the embodiments and the drawings of the disclosure at the time of filing of the application.

Further, identical symbols or numbers in the drawings of the disclosure denote components or elements configured to perform substantially identical functions.

Further, terms used herein are only for the purpose of describing particular embodiments and are not intended to limit to the disclosure. The singular form is intended to include the plural form as well, unless the context clearly indicates otherwise. The terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, although the terms "first," "second," etc. may be used herein to describe various elements, the elements are not restricted by the terms, and the terms are only used to distinguish one element from another. For example, a first element could be termed a second element, and similarly, a second element could be termed a first element without departing from the scope of the disclosure. The term "and/or" includes combinations of one or all of a plurality of associated listed items.

The terms "front", "rear", "left", "right", and the like as herein used are defined with respect to the drawings, but the terms may not restrict the shape and position of the respective components.

A display apparatus according to an embodiment may include: a display module including a substrate on which a plurality of light emitting diodes (LEDs) are mounted; a cabinet provided to support the display module; and a circuit case accommodating electronic components therein, and coupled to the cabinet, wherein the circuit case is provided to be detachable from and mountable on to a front side of the cabinet at a front of the cabinet, and the circuit case is provided to be detachable from and mountable on a rear side of the cabinet at a rear of the cabinet.

The display apparatus may further include a connection bracket provided to couple the circuit case to the cabinet, wherein the connection bracket may be coupled to the cabinet at the rear of the cabinet by a fastening member.

The circuit case may be coupled to the connection bracket at the front of the connection bracket by a fastening member.

The circuit case may be separated forward of the cabinet by releasing the coupling between the connection bracket and the circuit case at the front of the cabinet.

The circuit case may be separated rearward of the cabinet by releasing the coupling between the connection bracket and the circuit case at the rear of the cabinet.

The circuit case may include: a first case having one side thereof open and accommodating electronic components therein; and a second case provided to cover the open side of the first case.

The first case may include a first hinge bracket including a shaft protrusion and coupled to one side surface of the first case.

The second case may include a second hinge bracket including a shaft hole into which the shaft protrusion may be inserted and coupled to one side surface of the second case.

The second case may be rotatably coupled to the first case by the shaft protrusion being inserted into the shaft hole, and the second case may be separated from the first case by the shaft protrusion being separated from the shaft hole.

The circuit case may further include a case sealing member provided along a side edge of the first case and sealing a region between the first case and the second case.

The display module may further include a reinforcing member coupled to a rear surface of the display module, the cabinet may include a plurality of first magnets, and the circuit case may further include a plurality of second magnets.

The display module may be coupled to the cabinet by magnetic attraction between the plurality of first magnets and the reinforcement member and magnetic attraction between the plurality of second magnets and the reinforcement member.

The display module may include a plurality of display modules, and the cabinet may be provided to support the plurality of display modules.

The cabinet may include a plurality of cabinets, and the plurality of cabinets may be provided to be coupled to each other in a horizontal direction and a vertical direction.

Hereinafter, embodiments according to the disclosure will be described in detail with reference to the accompanying drawings.

Figure 2:
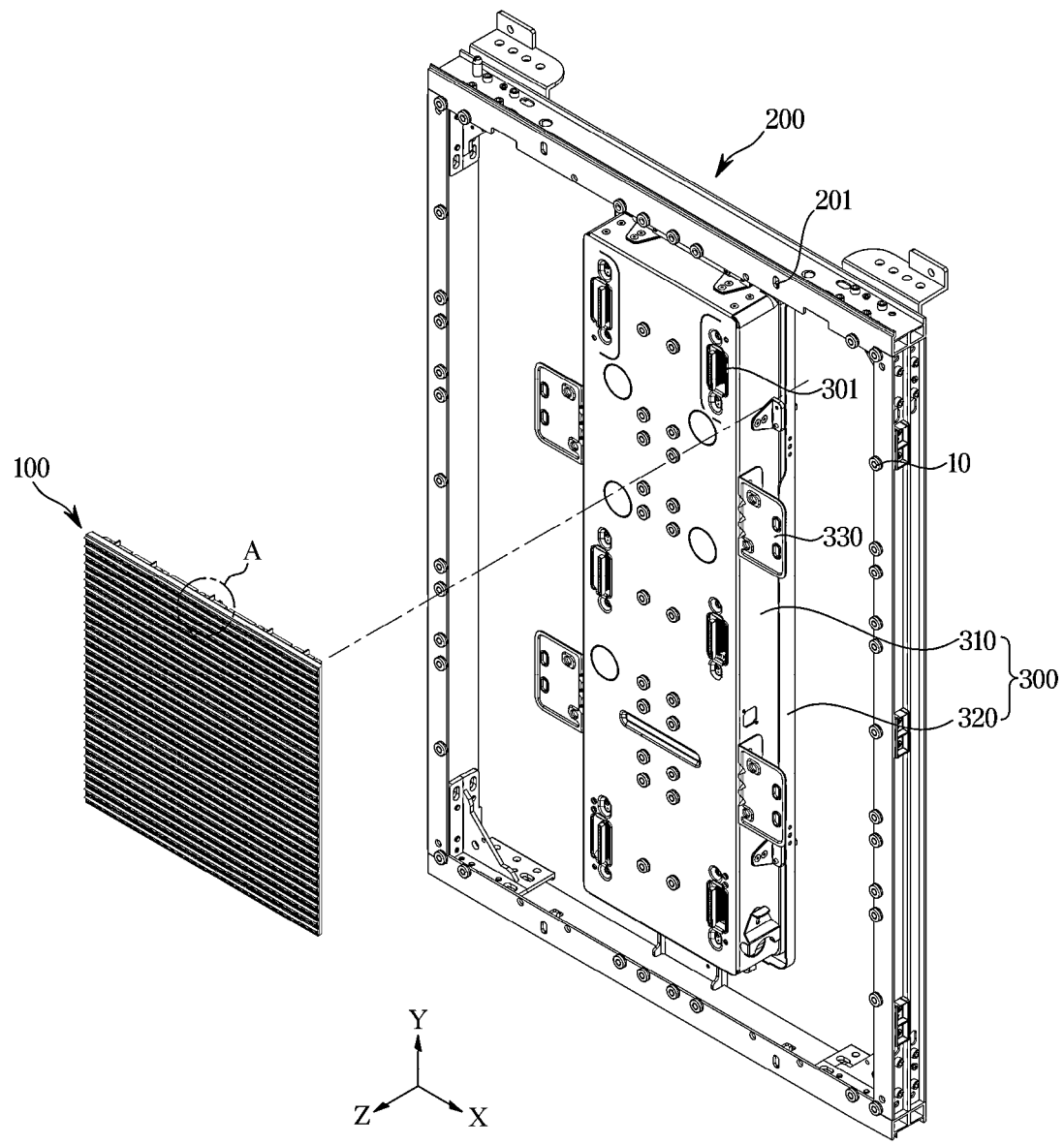
FIG. 2 is a view illustrating a cabinet and a display module separated from the cabinet in a display apparatus according to an embodiment, when viewed from the front.

FIG. 1 is a view illustrating a display apparatus according to an embodiment. FIG. 2 is a view illustrating a cabinet and a display module separated from the cabinet in a display apparatus according to an embodiment, which is viewed from the front.

In FIG. 1, the X-axis, the Y-axis, and the Z-axis directions perpendicular to each other are shown, in which the X-axis direction refers to a left to right direction, the Y-axis direction refers to an upper to lower direction, and the Z-axis direction refers to a front to rear direction.

The following description is made with reference to FIGS. 1 and 2. A display apparatus 1 is a device that displays information, materials, data, and the like in the form of characters, figures, graphs, images, and the like, and may be implemented as a billboard, an electric sign board, a screen, a television, a monitor, and the like. The display apparatus 1 may be installed on a wall or ceiling, or installed on an indoor or outdoor ground by a stand.

The display apparatus 1 may include a display module 100 displaying a screen, a cabinet 200 coupled to a rear side of the display module 100 to support the display module 100, and a circuit case 300 coupled to the cabinet 200 and accommodating electronic components therein.

In the display apparatus 1 according to an embodiment, six display modules 100 may be coupled to one cabinet 200. Specifically, two of the display modules 100 may be coupled to the one cabinet 200 in a left to right direction X, and three of the display modules 100 may be coupled to the one cabinet 200 in an upper to lower direction Y. That is, the display modules 100 may be coupled to the cabinet 200 in a 2×3 matrix form. However, the number of display modules 100 coupled to the cabinet 200 is not limited. Two or more display modules 100 may be coupled to one cabinet 200.

Referring to FIG. 1, the display apparatus 1 according to the embodiment may include eight (8) cabinets 200 and forty eight (48) display modules 100 coupled to the eight cabinets 200. As described above, the display apparatus 1 may implement a large sized screen by consecutively arranging a plurality of cabinets 200, to which a plurality of display modules 100 are coupled, in the left to right direction X and the upper to lower upper to lower direction Y. The number of cabinets 200 consecutively arranged in the left to right direction X and in the upper to lower direction Y is not limited, and as described above, the number of the plurality of display modules 100 coupled to the cabinet 200 is not limited.

Referring to FIG. 2, the display module 100 may be separably coupled to the cabinet 200. The display module 100 may be separated from the cabinet 200 forward of the cabinet 200. The display module 100 may be coupled to the cabinet 200 by magnetic force. The cabinet 200 may include a plurality of first magnets provided on a front surface thereof. The circuit case 300 may include a plurality of second magnets provided on a front surface thereof. The display module 100 may include a reinforcement member (140, see FIG. 5) provided on a rear surface thereof and coupled to the plurality of first magnets and the plurality of second magnets by magnetic attraction. The plurality of first magnets provided on the cabinet 200 and the plurality of second magnets provided on the circuit case 300 may be the same components. The plurality of first magnets and the plurality of second magnets may be collectively referred to as the plurality of magnets 10.

Figure 5:
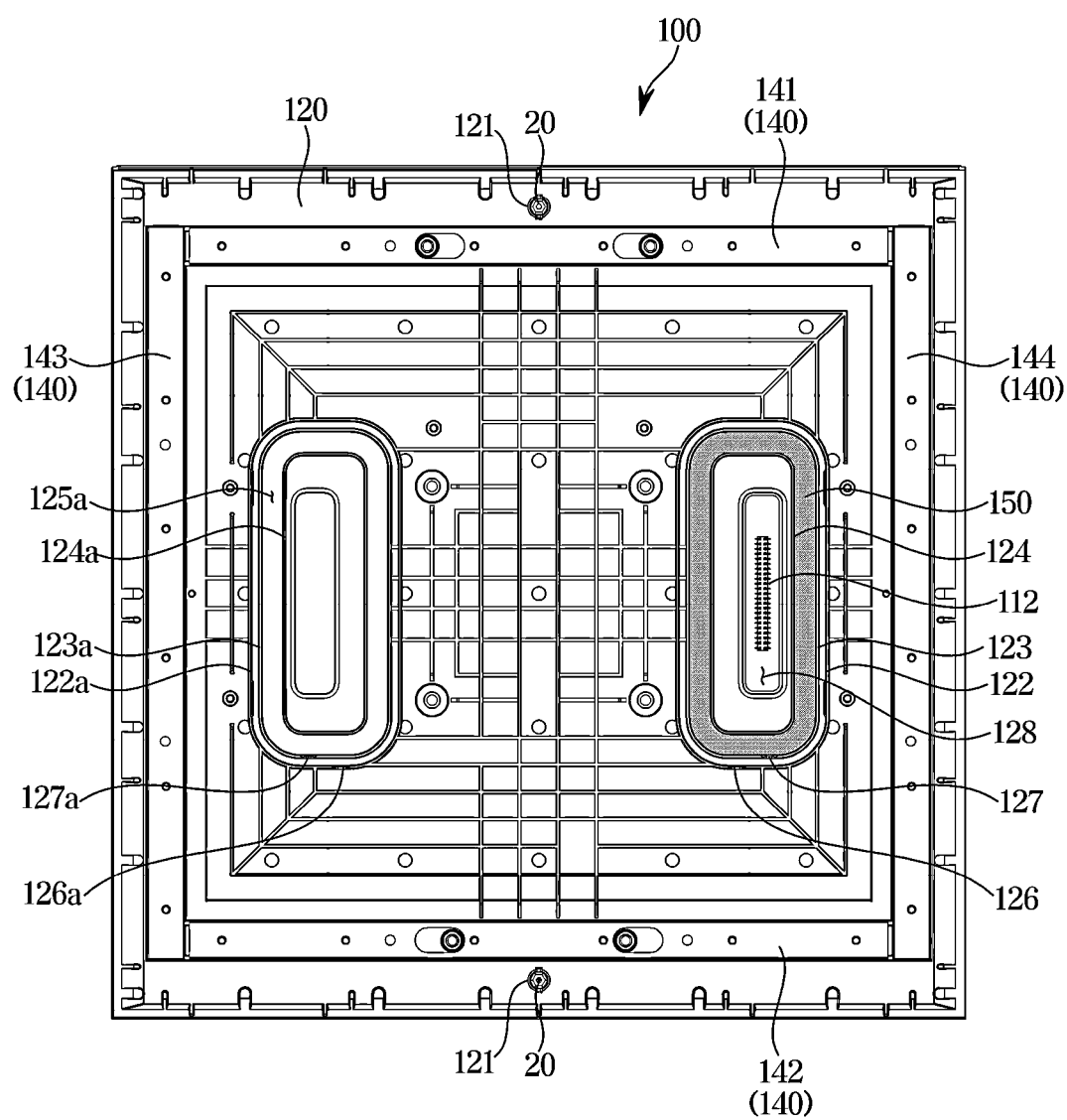
FIG. 5 is a rear view illustrating a display module in a display apparatus according to an embodiment.
Figure 6:
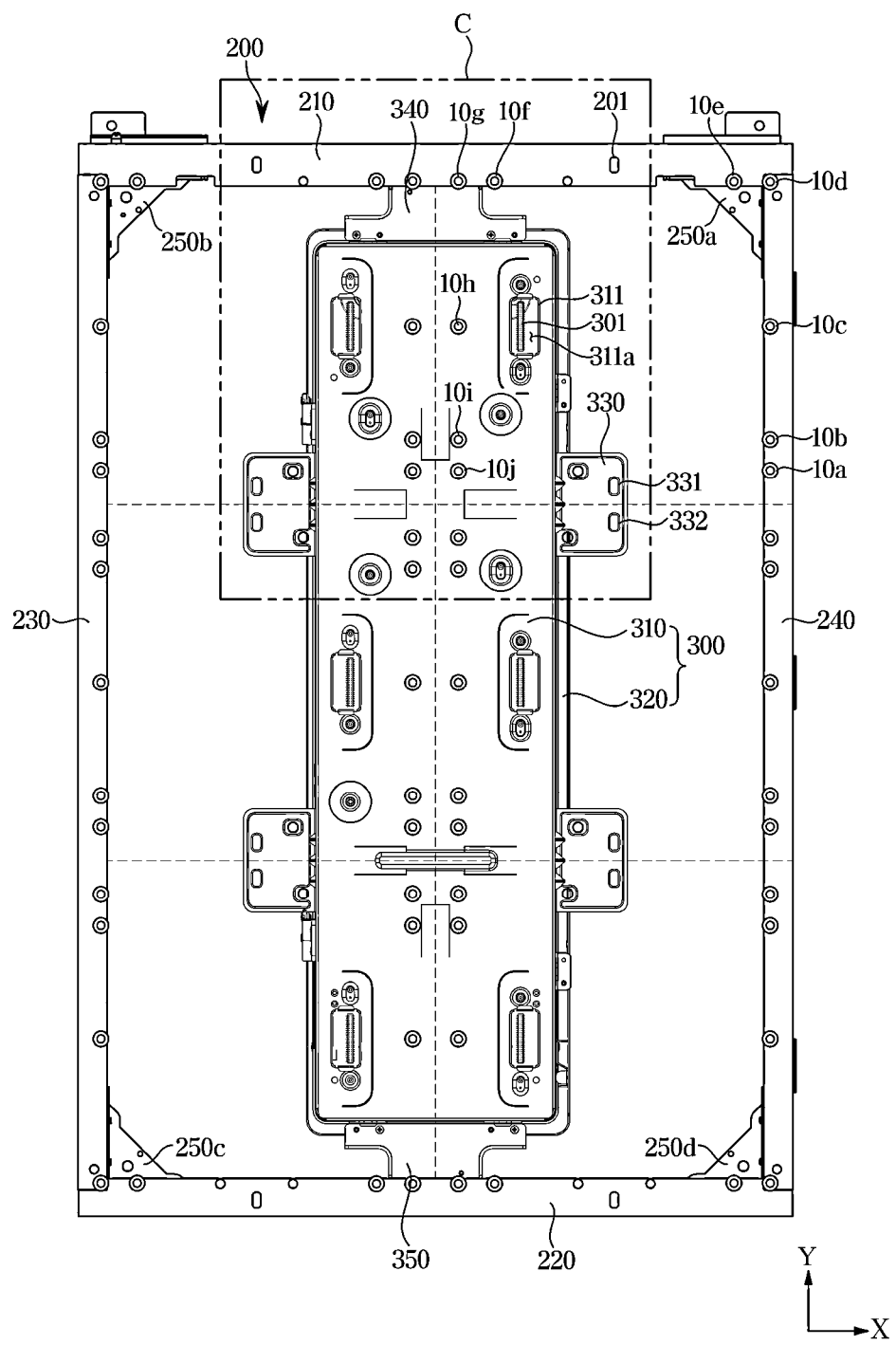
FIG. 6 is a front view illustrating a cabinet in a display apparatus according to an embodiment.

The cabinet 200 may include frames (the first frame 210, the second frame 220, the third frame 230, and the fourth frame 240, see FIG. 6) forming an outer edge of the cabinet 200. The circuit case 300 may be disposed inside of the frames (the first frame 210, the second frame 220, the third frame 230, and the fourth frame 240). The circuit case 300 may include a second connector 301 corresponding to a first connector (112, see FIG. 5) included in each of the plurality of display modules 100. The circuit case 300 may include a first case 310 having a hexahedral shape with one surface open and a second case 320 provided to cover the open surface of the first case 310.

As the first connectors 112 of the plurality of display modules 100 are coupled to the second connectors 301 of the circuit case 300, the plurality of display modules 100 may be electrically connected to each other. In addition, the plurality of display modules 100 may be supplied with power from a power supply device disposed inside the circuit case 300.

Figure 3:
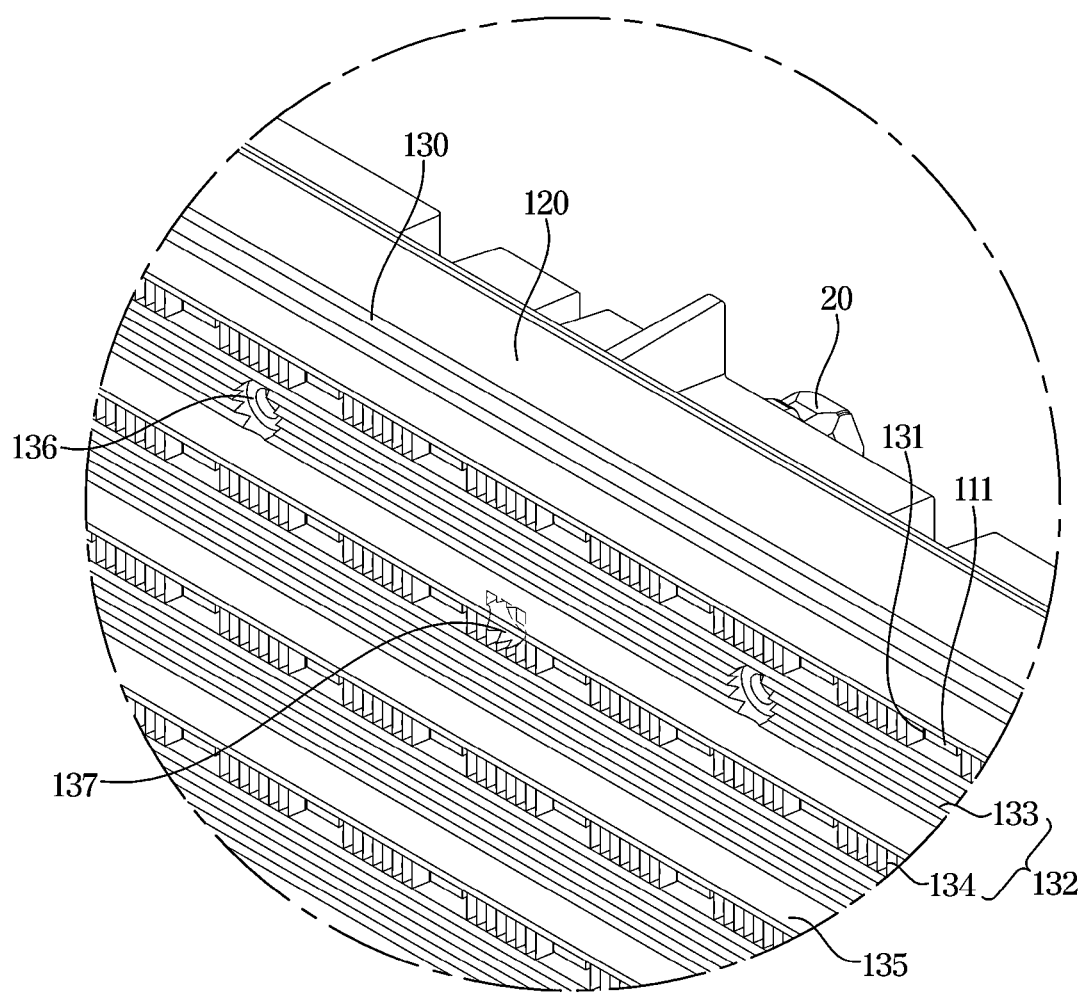
FIG. 3 is an enlarged view of portion A of FIG. 2 according to an embodiment.

FIG. 3 is an enlarged view of portion A of FIG. 2.

Referring to FIG. 3, the display module 100 may include a substrate (110, see FIG. 11) and a holder 120 covering side and rear surfaces of the substrate 110 and supporting the substrate 110. The substrate 110 may be attached to a front surface of the holder 120 through an adhesive, a double-sided adhesive tape, or the like, or coupled to the holder 120 through a fastening member, such as a screw.

A plurality of LEDs 111 may be mounted on the front surface of the substrate 110. The substrate 110 may be formed of a material, such as glass, polyimide (PI), or FR4.

The plurality of LEDs 111 may include a red LED, a green LED, and a blue LED as one pixel in a package. A plurality of LEDs 111 may be mounted on the substrate 110 in a matrix form. The plurality of LEDs 111 may be arranged to have regular intervals, and intervals between the plurality of LEDs 111 may be variously determined according to the resolution and size of the display apparatus 1.

The display module 100 may include a cover plate 130 provided to cover the front surface of the substrate 110. The cover plate 130 may include a plurality of LED holes 131 respectively corresponding to the plurality of LEDs 111 mounted on the substrate 110. The plurality of LEDs 111 may be exposed on the front surface of the cover plate 130 through the plurality of LED holes 131.

The substrate 110 may be accommodated inside of the cover plate 130 and the holder 120. The cover plate 130 and the holder 120 may be coupled to each other to form an inner space accommodating the substrate 110 therein.

The cover plate 130 may include a louver portion 132. The louver portion 132 may include a horizontal louver portion 133 and a vertical louver portion 134. The louver portion 132 may reduce or block moisture flowing into the plurality of LEDs 111. In addition, the cover plate 130 may include a loop portion 135 provided on upper sides of the plurality of LEDs 111. The loop portion 135 may protrude forward of the cover plate 130 to prevent water from being directly introduced into the plurality of LEDs 111 from above.

The cover plate 130 may include a fastening hole 136 into which a fastening member for coupling the cover plate 130, the substrate 110, and the holder 120 is inserted, and a fixing hole 137 into which a fixing member 20 is inserted.

Figure 4:
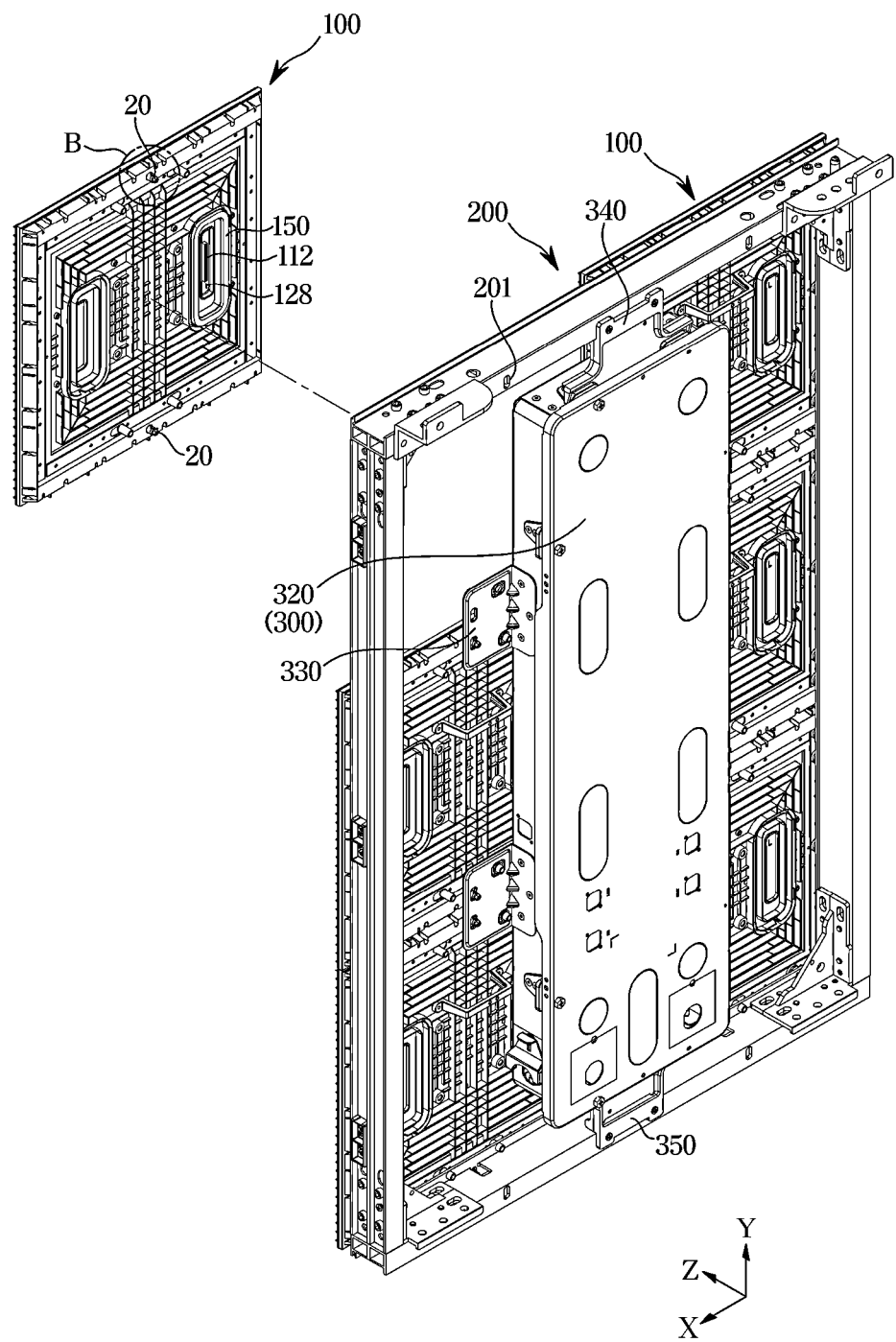
FIG. 4 is a view illustrating a cabinet and a display module separated from the cabinet in a display apparatus according to an embodiment, when viewed from the rear.

FIG. 4 is a view illustrating a cabinet and a display module separated from the cabinet in a display apparatus according to an embodiment, which is viewed from the rear. FIG. 5 is a rear view illustrating a display module in a display apparatus according to an embodiment.

Referring to FIG. 4, the display module 100 may be separated forward of the cabinet 200. As described above, the display module 100 may be coupled to the cabinet 200 by magnetic force. A plurality of magnets (10, see FIG. 2) may be provided on the front surface of the cabinet 200, and a reinforcement member (140, see FIG. 5) attracted by magnetic attraction of the plurality of magnets 10) may be provided on the rear surface of the display module 100.

Referring to FIG. 5, the reinforcement member 140 may be coupled to the rear surface of the holder 120. The reinforcement member 140 may be disposed on an edge of the rear surface of the holder 120. The reinforcement member 140 may include a first reinforcement member 141, a second reinforcement member 142, a third reinforcement member 143, and a fourth reinforcement member 144. The first reinforcement member 141 may be provided adjacent to an upper edge of the rear surface of the holder 120 and may extend in the horizontal direction. The second reinforcement member 142 may be provided adjacent to a lower edge of the rear surface of the holder 120 and may extend in the horizontal direction. The third reinforcement member 143 may be provided adjacent to a left edge of the rear surface of the holder 120 and may extend in the vertical direction. The fourth reinforcement member 144 may be provided adjacent to a right edge of the rear surface of the holder 120 and may extend in the vertical direction.

The reinforcement member 140 may be coupled to the rear surface of the holder 120 to reinforce the strength of the display module 100. The reinforcement member 140 may prevent the display module 100 from bending. The reinforcement member 140 may prevent physical deformation of the display module 100.

The reinforcement member 140 may be formed of a material that is attracted by the magnetic force of the magnet 10. The reinforcement member 140 may be formed of a material that is magnetizble by an external magnetic force. The reinforcement member 140 and the magnet 10 may be attracted to each other by polarity of the reinforcement member 140 obtained from the external magnetic force. The reinforcement member 140 may include a magnetic material that interacts with the magnet 10. The reinforcement member 140 may include iron (Fe).

The display module 100 may include a fixing member 20. The fixing members 20 may be respectively provided on the upper side and the lower side of the rear surface of the display module 100. According to one embodiment, the fixing members 20 may be provided at the upper center region of the rear surface and the lower center region of the rear surface of the display module 100, but the positions thereof are not limited.

The fixing member 20 may prevent the display module 100 from being separated from the cabinet 200. The display module 100 may be coupled by a magnetic attraction between the plurality of magnets 10 and the reinforcement member 140, but in response to application of a force greater than the magnetic attraction to separate the display module 100 from the cabinet 200, the display module 100 may be separated from the cabinet 200. In order to prevent the separation, the fixing member 20 may be provided to prevent the display module 100 from moving forward of the cabinet 200.

The display module 100 may include a first connector hole 128 that allows the first connector 112 provided on the rear surface of the substrate 110 to be exposed on the rear surface of the display module 100. The display module 100 may include a first waterproof rib 122, a second waterproof rib 123, and a third waterproof rib 124 protruding rearward from the rear surface of the holder 120 to block water from being introduced into the first connector hole 128. A sealing groove (125, see FIG. 7) may be formed between the second waterproof rib 123 and the third waterproof rib 124, and a sealing member 150 may be provided in the sealing groove 125.

The first waterproof rib 122, the second waterproof rib 123, and the third waterproof rib 124 may each be provided in a ring shape. The second waterproof rib 123 may be provided inside of the first waterproof rib 122, and the third waterproof rib 124 may be provided inside of the second waterproof rib 123.

The first waterproof rib 122, the second waterproof rib 123, and the third waterproof rib 124 may be provided to be in contact with the front surface of the circuit case 300 to prevent moisture from being introduced from the outer side to the inside of the first waterproof rib 122, the second waterproof rib 123, and the third waterproof rib 124.

The sealing member 150 may be provided in the sealing groove 125 formed between the second waterproof rib 123 and the third waterproof rib 124. The sealing member 150 may be provided to correspond to the shape of the sealing groove 125. The sealing member 150 may be provided in a substantially ring shape. The sealing member 150 may be formed of a material capable of changing in volume, and may include, for example, rubber.

According to an embodiment, the sealing member 150 may be attached to the rear surface of the display module 100, but is not limited thereto. The sealing member 150 may be attached to the front surface of the circuit case 300 to correspond to the sealing groove 125.

The display module 100 may include a first waterproof rib 122a, a second waterproof rib 123a, a third waterproof rib 124a, and a sealing groove 125a bilaterally symmetrical to the first waterproof rib 122, the second waterproof rib 123, the third waterproof rib 124, and the sealing groove 125. The first waterproof rib 122a, the second waterproof rib 123a, and the third waterproof rib 124a may be referred to as 'left side waterproof ribs,' and the first waterproof rib 122, the second waterproof rib 123, and the third waterproof rib 124 may be referred to as 'right side waterproof ribs.'

The left side waterproof ribs (the first waterproof rib 122a, the second waterproof rib 123a, and the third waterproof rib 124a) may have the same structures bilaterally symmetrical to those of the right side waterproof ribs (the first waterproof rib 122, the second waterproof rib 123, and the third waterproof rib 124). This is to allow the display modules 100 to be coupled to both a left column and a right column between two columns of the cabinet 200. For example, when the display module 100 is coupled to the right column of the cabinet 200, the first connector 112 may be disposed inside of the right side waterproof ribs (the first waterproof rib 122, the second waterproof rib 123, and the third waterproof rib 124), and the sealing member 150 may be provided in the (right side) sealing groove 125 to prevent water from being introduced into the first connector 112. Conversely, when the display module 100 is coupled to the left column of the cabinet 200, the first connector 112 may be disposed inside of the left side waterproof ribs (the first waterproof rib 122a, the second waterproof rib 123a, and the third waterproof rib 124a), and the sealing member 150 may be provided in the (left side) sealing groove 125a. In addition, the first connector hole may not be provided inside of a waterproof rib in which the first connector 112 is not disposed. Referring to FIG. 5, a first connector hole may not be provided inside of the left side third waterproof rib 124a, and a first connector hole 128 may be provided inside of the right side third waterproof rib 124 to allow the first connector 112 to be exposed there through.

In the following description, the right side waterproof ribs (the first waterproof rib 122, the second waterproof rib 123, and the third waterproof rib 124) and the (right side) sealing groove 125 will be referred to as waterproof ribs (the first waterproof rib 122, the second waterproof rib 123, and the third waterproof rib 124) and a sealing groove 125.

FIG. 6 is a front view illustrating a cabinet in a display apparatus according to an embodiment.

The cabinet 200 may be formed by coupling (connecting, attaching) four frames (the first frame 210, the second frame 220, the third frame 230, and the fourth frame 240) each extending in one direction. The four frames (the first frame 210, the second frame 220, the third frame 230, and the fourth frame 240) may be coupled to each other by four corner brackets (the first corner bracket 250a, the second corner bracket 250b, the third corner bracket 250c, and the fourth corner bracket 250d.).

Specifically, the frames may include a first frame 210 forming an upper edge of the cabinet 200, a second frame 220 forming a lower edge of the cabinet 200, a third frame 230 forming a left edge of the cabinet 200, and a fourth frame 240 forming a right edge of the cabinet 200. The first frame 210 and the second frame 220 may be disposed in the horizontal direction, and the third frame 230 and the fourth frame 240 may be disposed in the vertical direction.

The first frame 210 and the fourth frame 240 may be coupled to each other by a first corner bracket 250a. The first frame 210 and the third frame 230 may be coupled to each other by a second corner bracket 250b. The second frame 220 and the third frame 230 may be coupled to each other by a third corner bracket 250c, and the second frame 220 and the fourth frame 240 may be coupled to each other by a fourth corner bracket 250d.

The first frame 210, the second frame 220, the third frame 230, and the fourth frame 240 may be coupled to each other by the first corner bracket 250a, the second corner bracket 250b, the third corner bracket 250c, and the fourth corner bracket 250d to have a rectangular frame shape.

The circuit case 300 may be located at the central region inside of the frames (the first frame 210, the second frame 220, the third frame 230, and the fourth frame 240). The circuit case 300 may be coupled to the first frame 210 and the second frame 220 by a first connection bracket 340 and a second connection bracket 350 respectively provided on the upper side and the lower side of the circuit case 300.

The circuit case 300 may include a first case 310 forming front and side surfaces of the circuit case 300 and having a rear surface thereof open, and a second case 320 provided to cover the open rear surface of the first case 310. The first case 310 and the second case 320 may be coupled to each other to form the circuit case 300. The first case 310 and the second case 320 may be coupled to each other so that an inside of the first case 310 and the second case 320 may be sealed. The first case 310 and the second case 320 may be coupled to each other to block inflow of water from the outside.

The first case 310 may have a second connector hole 311a formed through the front surface thereof. The first case 310 may include a rib 311 provided along the circumference of the second connector hole 311a and protruding forward. A second connector 301 may be disposed inside of the second connector hole 311a.

The second connector hole 311a, the second connector 301, and the rib 311 may be provided corresponding in number to the number of display modules 100 coupled to the cabinet 200.

Inside the circuit case 300, provided may be a power supply device provided to supply power to the display module 100, a control board provided to control the display module 100, and the like. In this specification, electronic parts may include the power supply device and the control board described above.

The circuit case 300 may include a support bracket 330 provided to support the display module 100. The support brackets 330 may be coupled to both sides of the circuit case 300. In addition, the support brackets 330 may be provided above and below each other, on both sides of the circuit case 300. According to an embodiment, four support brackets 330 may be coupled to the circuit case 300.

The cabinet 200 may include a plurality of magnets 10. In addition, the circuit case 300 may include a plurality of magnets 10.

Specifically, the cabinet 200 may include a plurality of magnets 10 disposed spaced apart from each other on the front surfaces of the first frame 210, the second frame 220, the third frame 230, and the fourth frame 240.

In addition, the circuit case 300 may include a plurality of magnets 10 disposed spaced apart from each other on the front surface of the circuit case 300.

Referring to FIG. 6, the cabinet 200 and the circuit case 300 according to the embodiment may include ten magnets 10 for each of the display module 100. The cabinet 200 and the circuit case 300 may include a total of sixty magnets 10. The cabinet 200 may include thirty eight (38) magnets 10, and the circuit case 300 may include twenty two (22) magnets 10. However, the number and position of the magnets 10 are not limited thereto, and the number and position of the magnets 10 may be changed.

For example, in order to support the display module 100 coupled to the upper right side of the cabinet 200, the cabinet 200 may include the first to seventh magnets 10a, 10b, 10c, 10d, 10e, 10f, and 10g, and the circuit case 300 may include the eighth to tenth magnets 10h, 10i, and 10j.

As described above, the plurality of magnets 10 may attract the reinforcement member 140, which is formed of a magnetizable material and disposed on the rear surface of the display module 100, by magnetic attraction, so that the display module 100 may be coupled to the cabinet 200.

Figure 7:
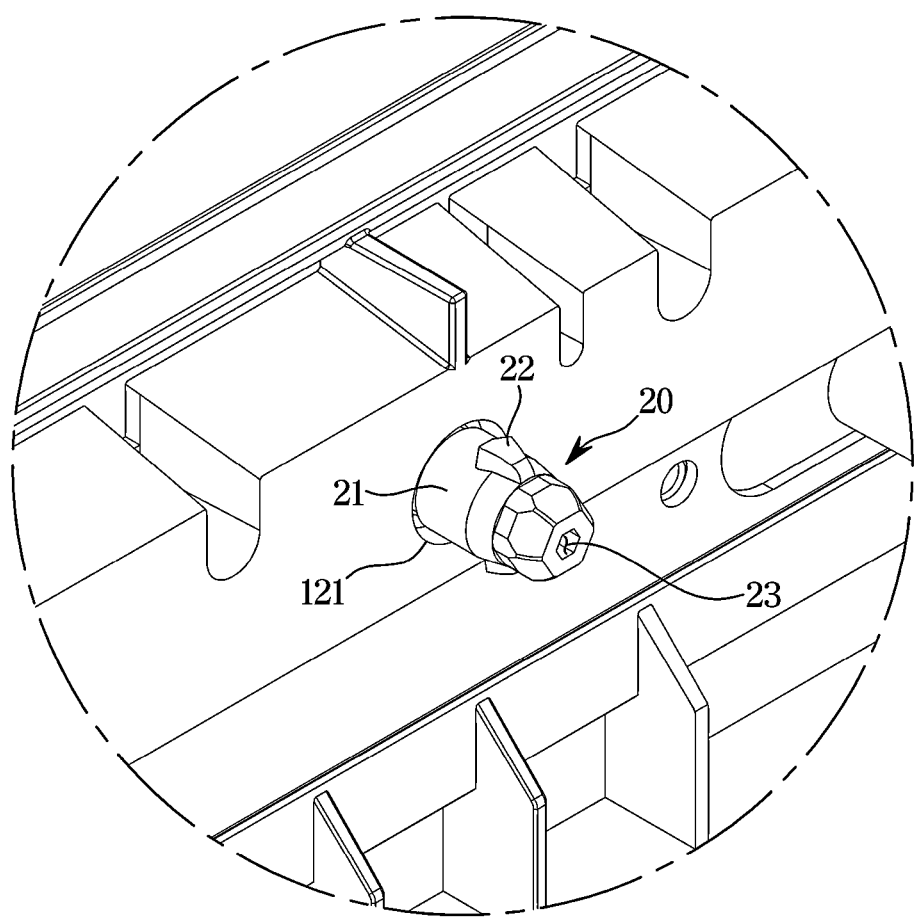
FIG. 7 is an enlarged view of portion B of FIG. 4 according to an embodiment.

FIG. 7 is an enlarged view of portion B of FIG. 4.

According to an embodiment, the fixing member 20 may be provided in the form of a wing nut. Specifically, the fixing member 20 may include a body portion 21 having a cylindrical shape and inserted into a holder hole 121 of the holder 120 and a protrusion portion 22 protruding outward of the body portion 21. The protrusion portions 22 may be provided as a pair.

The cabinet 200 may include a through hole 201 through which the fixing member 20 may pass. The fixing member 20 may be provided to be rotatable between a disengagement position in which the fixing member 20 is allowed to pass through the through hole 201 and an engagement position in which the fixing member 20 is prevented from passing through the through hole 201 by the protrusion portion 22 being caught in the through hole 201.

The user may rotate the fixing member 20, which protrudes rearward of the cabinet 200 through the through hole 201, at the rear of the cabinet 200 by hands without a separate tool, thereby engaging the display module 100 with the cabinet 200, or disengaging the display module 100 from the cabinet 200. When the fixing member 20 passed through the through hole 201 is in the disengagement position and a force greater than or equal to magnetic force is applied to the display module 100, the display module 100 may be separated from the cabinet 200. When the fixing member 20 passed through the through hole 201 is in the engagement position, the display module 100 may be prevented from being separated from the cabinet 200.

The display module 100 may include a fixing hole (137, see FIG. 3) through which at least a portion of the fixing member 20 is exposed on the front surface of the display module 100. The fixing hole 137 may be formed by passing through the display module 100. One end of the fixing member 20 may be exposed on the front surface of the display module 100 through the fixing hole 137. The one end of the fixing member 20 may be provided with a groove having a predetermined shape. For example, the one end of the fixing member 20 may be provided with the same hexagonal groove 23 as that provided at the other end of the fixing member 20.

A user may rotate the fixing member 20 at the front of the display module 100 using a separate tool having a shape corresponding to the groove formed in the one end of the fixing member 20. As described above, the display module 100 may become separable from the cabinet 200 by rotating the fixing member 20. Through this, the display module 100 may be separated from the cabinet 200 even at the front of the display module 100 without approaching the rear surface of the cabinet 200.

As described above, the display module 100 may be coupled to the cabinet 200 by the magnetic attraction between the magnet 10 and the reinforcement member 140. In order to prevent the display module 100 from being separated from the cabinet 200 in response to application of an external force greater than or equal to the magnetic attraction, the display module 100 may include the fixing member 20. When the fixing member 20 is positioned at the engagement position, the display module 100 may be prevented from being separated from the cabinet 200.

Figure 8:
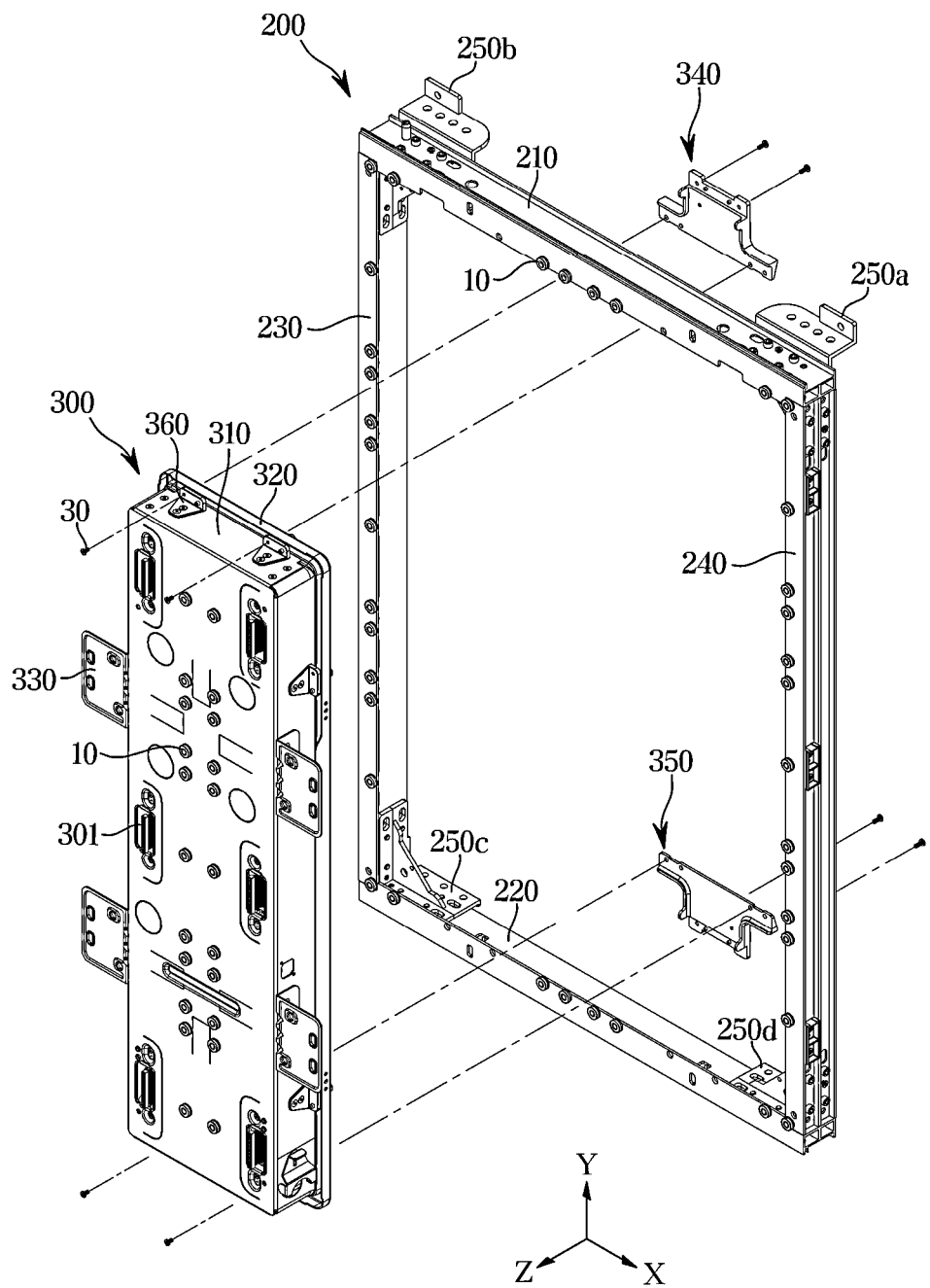
FIG. 8 is a view illustrating a cabinet and a circuit case separated from the cabinet in a display apparatus according to an embodiment.

FIG. 8 is a view illustrating a cabinet and a circuit case separated from the cabinet in a display apparatus according to an exemplary embodiment.

Referring to FIG. 8, the circuit case 300 may be detachably coupled to the cabinet 200. The circuit case 300 may be coupled to the cabinet 200 by the first connection bracket 340 and the second connection bracket 350.

The first connection bracket 340 may couple the upper side of the circuit case 300 to the first frame 210. The second connection bracket 350 may couple the lower side of the circuit case 300 to the second frame 220.

As will be described below, the circuit case 300 may be separated from the cabinet 200 at the front of the cabinet 200, and the circuit case 300 may be separated from the cabinet 200 at the rear of the cabinet 200.

The circuit case 300 may further include a coupling bracket 360 coupling the first case 310 and the second case 320 together. As the coupling bracket 360 is coupled to the first case 310 and the second case 320, the first case 310 and the second case 320 may be coupled to each other.

Figure 9:
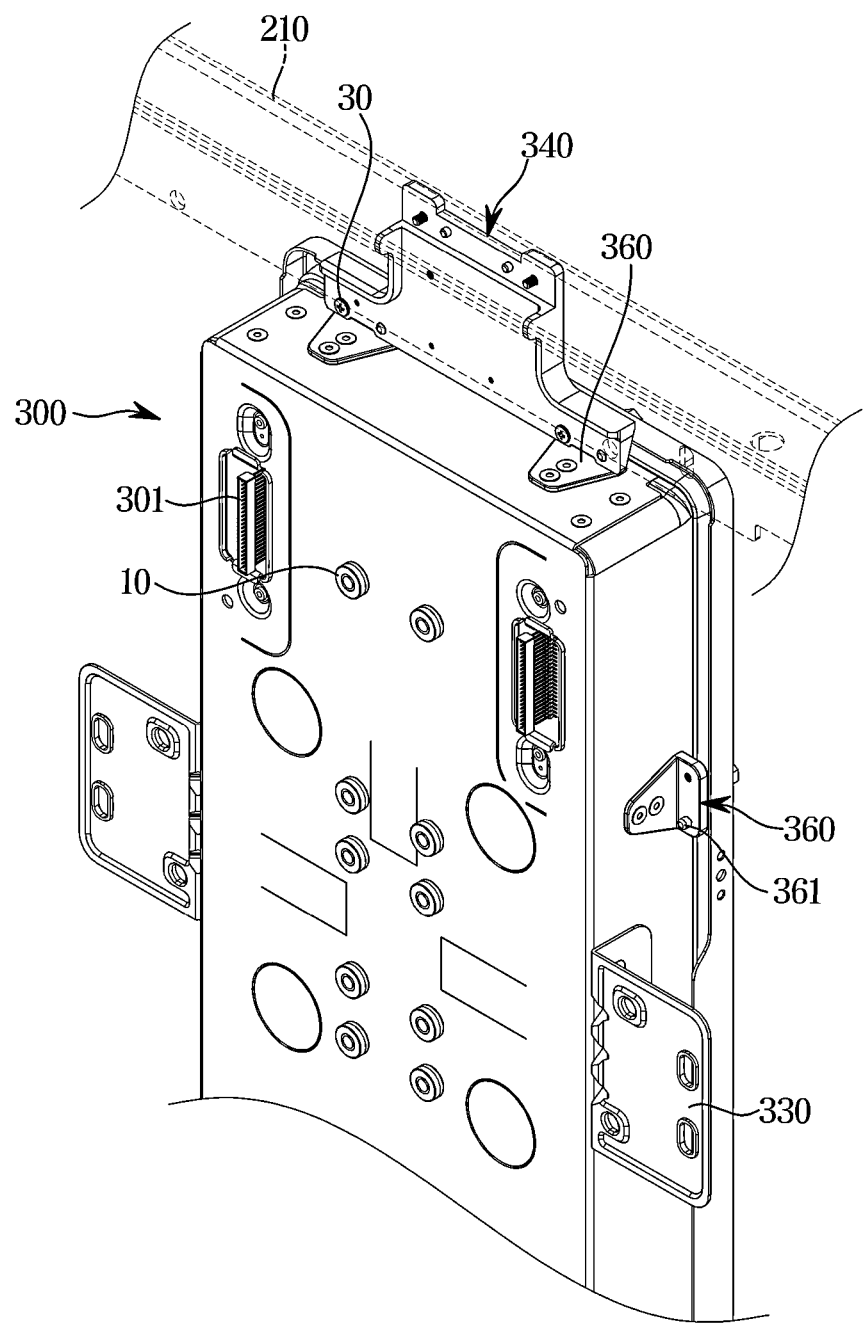
FIG. 9 is an enlarged view of portion C of FIG. 6 when viewed at a different angle according to an embodiment.
Figure 10:
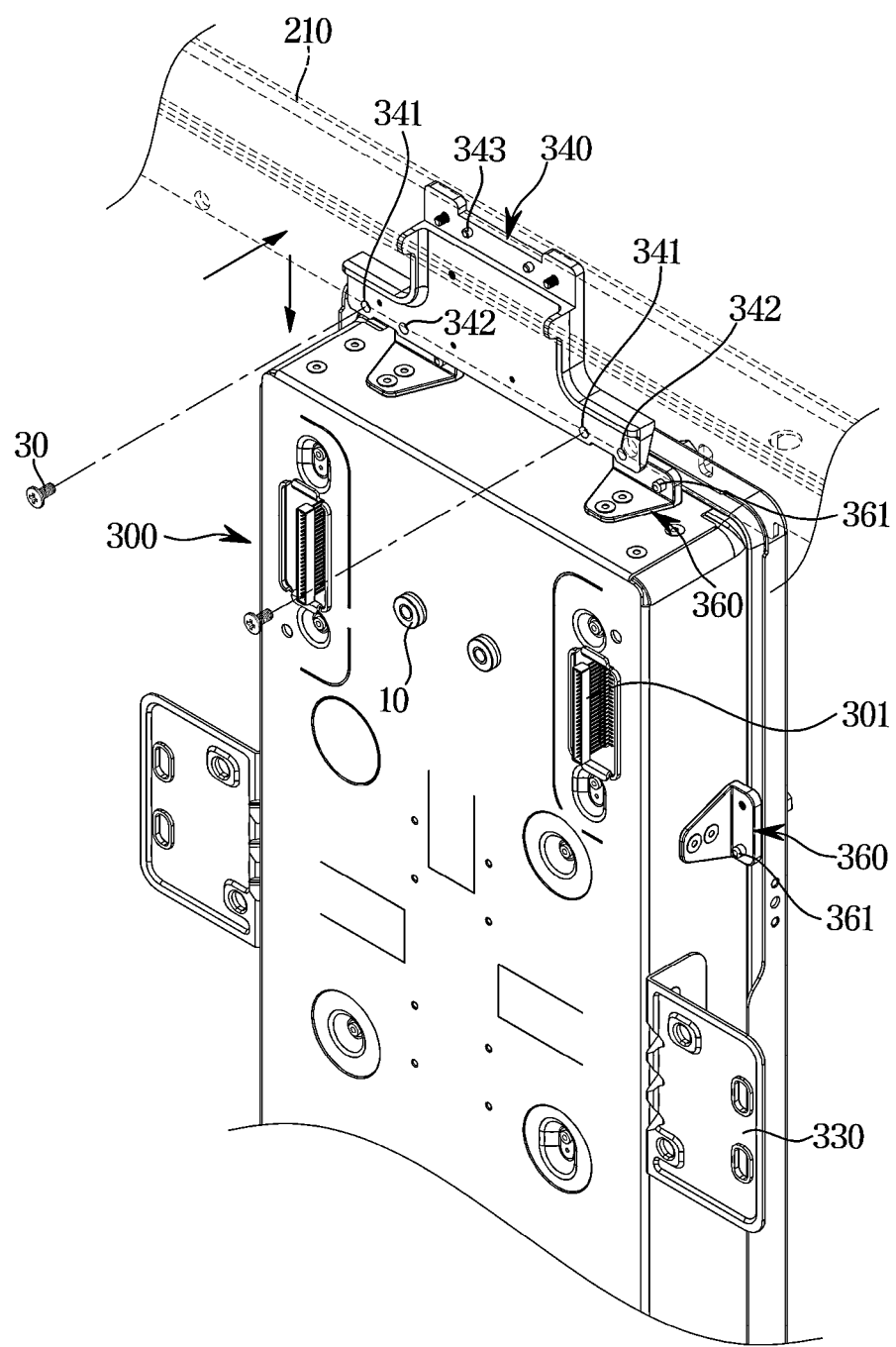
FIG. 10 is a view illustrating a process in which a circuit case is separated forward of a cabinet in a display apparatus shown in FIG. 9, according to an embodiment.

FIG. 9 is an enlarged view of portion C of FIG. 6 when viewed at a different angle. FIG. 10 is a view illustrating a process in which a circuit case is separated forward of a cabinet in a display apparatus shown in FIG. 9.

As described above, the fixing member 20 may be rotated even at the front of the display apparatus 1 using a separate tool. After rotating the fixing member 20 to a disengaged position, the plurality of display modules 100 may be detached from the cabinet 200.

In a state in which the plurality of display modules 100 are separated from the cabinet 200, the front surface of the circuit case 300 may be exposed to the front of the display apparatus 1 as shown in FIG. 9.

In order to separate the circuit case 300 forward of the display apparatus 1, a first fastening member 30 exposed on the front side of the first connection bracket 340 may be removed. The first fastening member 30 may be provided in various forms. For example, the first fastening member 30 may include a screw.

In FIG. 10, as the first fastening member 30 exposed on the front side of the first connection bracket 340 is removed, the circuit case 300 may be separable from the first connection bracket 340. The separated circuit case 300 may be slightly moved rearward and downward of the cabinet 200 and then withdrawn forward of the cabinet 200.

The first connection bracket 340 may include (i) a first fastening hole 341 into which the first fastening member 30 is inserted and/or fastened and (ii) a first guide hole 342 into which a first guide protrusion 361 of the coupling bracket 360 is inserted. As the first guide protrusion 361 is inserted into the first guide hole 342, the location of the circuit case 300 may be guided before the circuit case 300 is coupled to the first connection bracket 340 and the second connection bracket 350.

Figure 11:
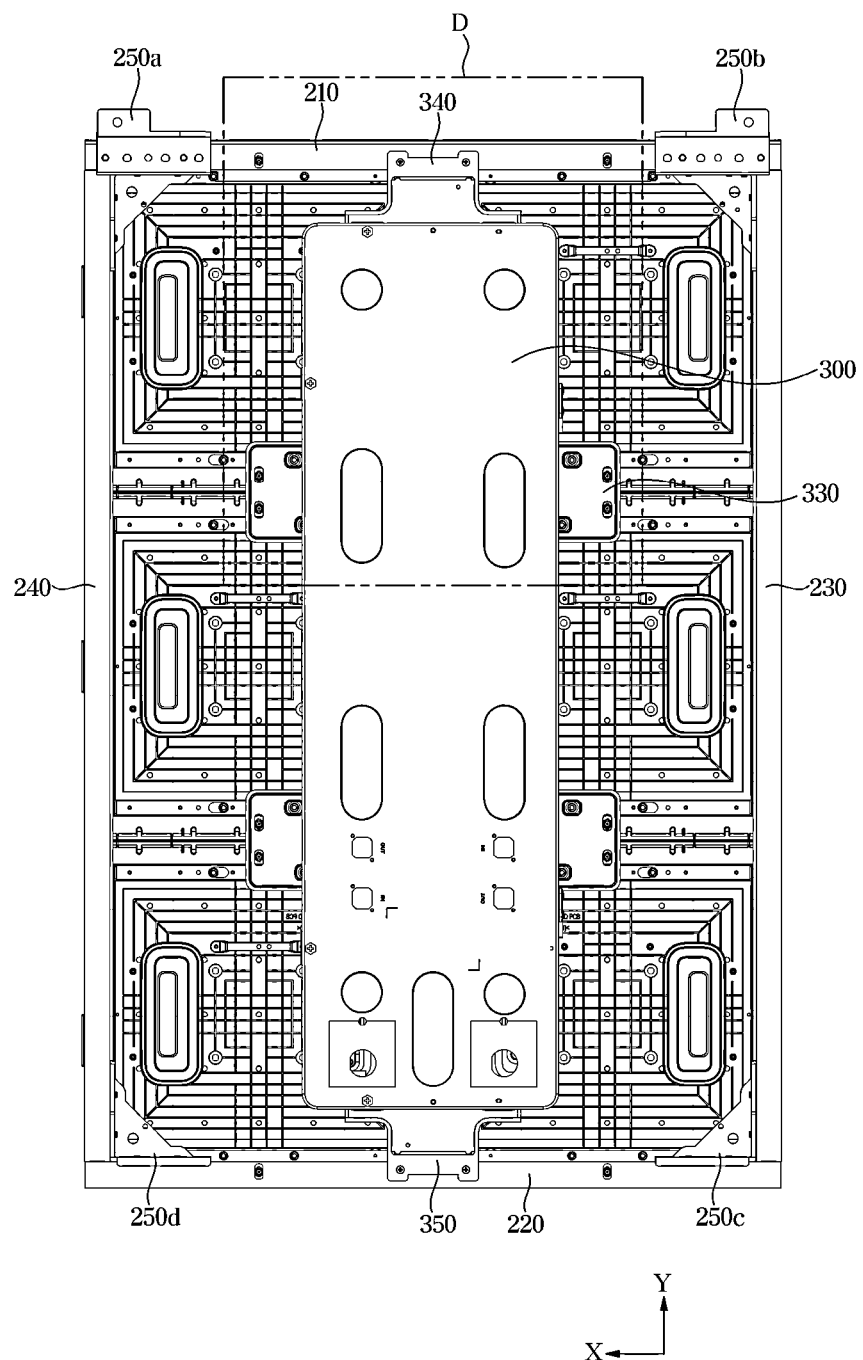
FIG. 11 is a rear view illustrating a display apparatus according to an embodiment.
Figure 12:
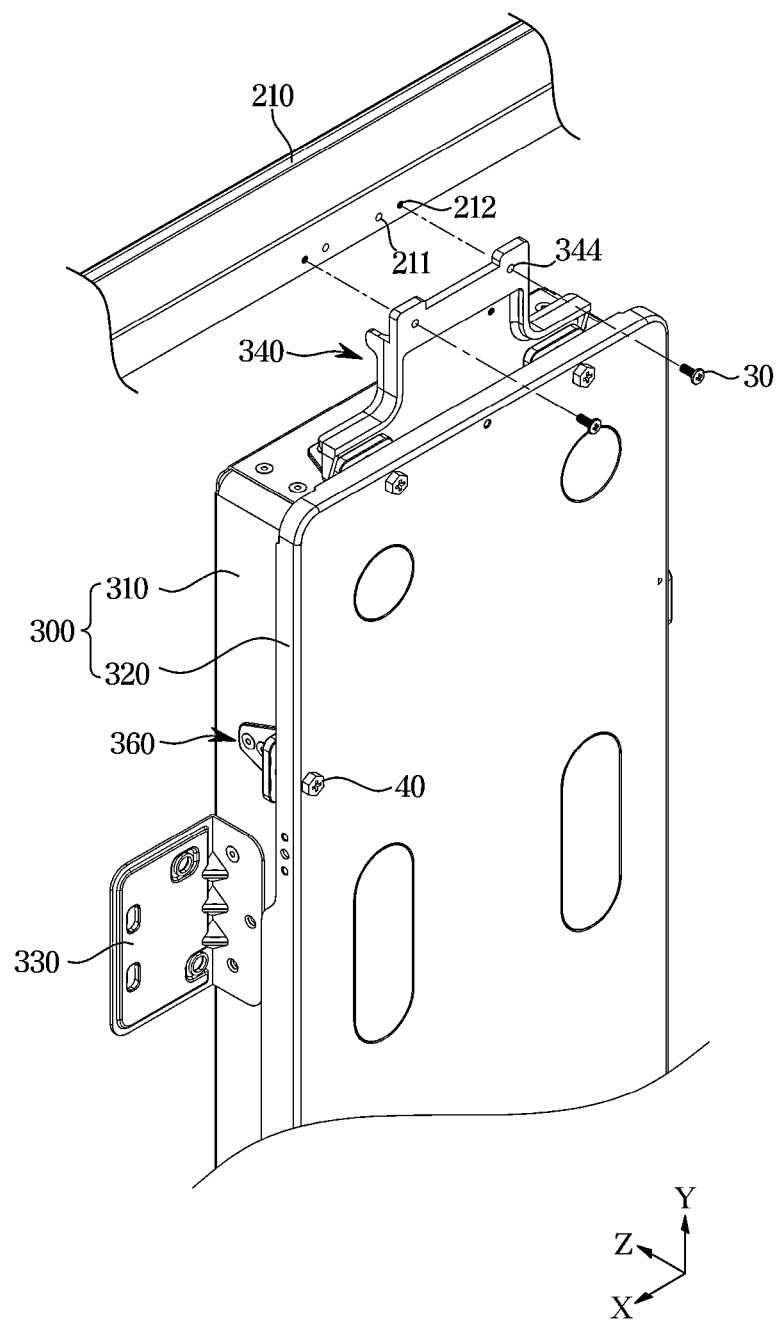
FIG. 12 is an enlarged view of portion D of FIG. 11 when viewed at a different angle according to an embodiment.

FIG. 11 is a rear view illustrating a display apparatus according to an embodiment. FIG. 12 is an enlarged view of portion D of FIG. 11 when viewed at a different angle.

Referring to FIG. 11, the rear surface of the circuit case 300 may be exposed on the rear side of the cabinet 200 without the display module 100 being separated from the cabinet 200. When there is a need to separate the circuit case 300 rearward of the cabinet 200, the first connection bracket 340 and the second connection bracket 350 may be separated from the cabinet 200. As the first connection bracket 340 and the second connection bracket 350 are separated from the cabinet 200, the circuit case 300, the first connection bracket 340, and the second connection bracket 350 may be separated from the cabinet as one part.

The first connection bracket 340 may include a second guide protrusion 343 provided to guide a coupling position of the first connection bracket 340 with respect to the cabinet 200. The first frame 210 of the cabinet 200 may include a second guide hole 211 into which the second guide protrusion 343 is inserted. The first frame 210 may include a second fastening hole 212 spaced laterally from the second guide hole 211 and into which the first fastening member 30 is inserted.

The first connection bracket 340 may include a third fastening hole 344 into which the first fastening member 30 is inserted. The second fastening hole 212 and the third fastening hole 344 may be provided to correspond to each other.

A second fastening member 40 may couple the second case 320 to the first case 310. The second fastening member 40 may be coupled to the coupling bracket 360 by passing through the second case 320, to thereby coupling the second case 320 to the first case 310.

Figure 13:
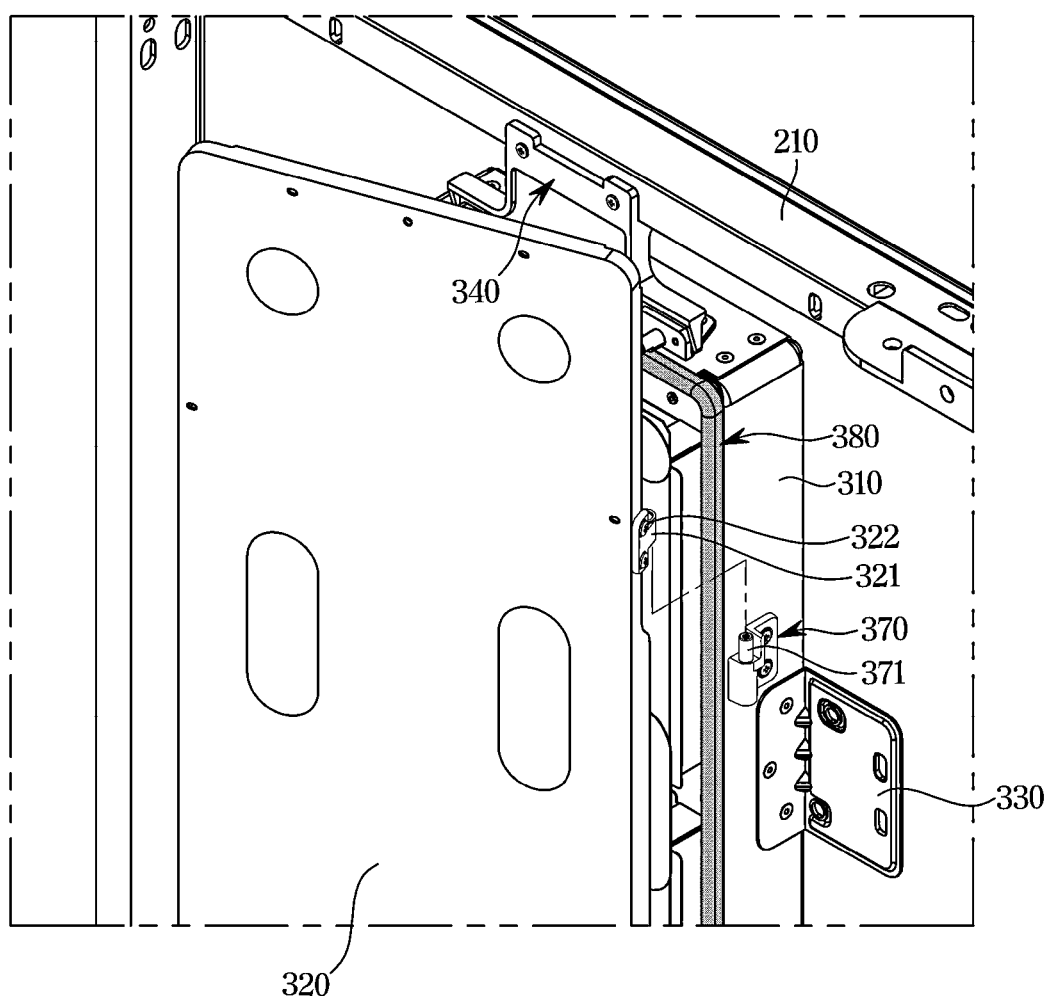
FIG. 13 is a view illustrating a coupling relationship between a first case and a second case in a display apparatus according to an embodiment.

FIG. 13 is a view illustrating a coupling relationship between a first case and a second case in a display apparatus according to an embodiment.

Referring to FIG. 13, a case sealing member 380 may be provided between the first case 310 and the second case 320. The case sealing member 380 may be provided along the circumference of the first case 310. The case sealing member 380 may be provided to seal a region between the first case 310 and the second case 320.

The first case 310 may include a first hinge bracket 370. The first hinge bracket 370 may include a shaft protrusion 371.

The second case 320 may include a second hinge bracket 321. The second hinge bracket 321 may include a shaft hole 322.

The shaft protrusion 371 may be provided to be rotatable within the shaft hole 322. The second case 320 may be separated from the first case 310 only by lifting the second case 320 upward while the shaft protrusion 371 is inserted into the shaft hole 322.

Conversely, by simply positioning the second case 320 on the first case 310 such that the shaft protrusion 371 is inserted into the shaft hole 322, the second case 320 may be rotatably coupled to the first case 310. In addition, the second case 320 may open and close the open rear surface of the first case 310.

Although the disclosure has been shown and described in relation to specific embodiments, it would be appreciated by those skilled in the art that changes and modifications may be made in these embodiments without departing from the principles and scope of the disclosure, the scope of which is defined in the claims and their equivalents.

What is claimed is:

1. A display apparatus comprising:
   a display module comprising a substrate on which a plurality of light emitting diodes (LEDs) are mounted;
   a cabinet provided to support the display module; and
   a circuit case attached to the cabinet,
   wherein the circuit case is provided to be detachable from and mountable on a front side of the cabinet,
   wherein the circuit case is provided to be detachable from and mountable on a rear side of the cabinet,
   wherein the circuit case comprises: a first case comprising an open side; and a second case provided to cover the open side of the first case, and
   wherein the first case accommodates electronic components,
   wherein the display module further comprises a reinforcing member attached to a rear surface of the display module, wherein the cabinet comprises a plurality of first magnets, and wherein the circuit case further comprises a plurality of second magnets; and
   wherein the display module is attached to the cabinet by a first magnetic attraction between the plurality of first magnets and the reinforcing member, and wherein the display module is attached to the cabinet by a second magnetic attraction between the plurality of second magnets and the reinforcing member.

2. The display apparatus of claim 1, further comprising a connection bracket provided to attach the circuit case to the cabinet, wherein the connection bracket is attached to the rear side of the cabinet by a fastening member.

3. The display apparatus of claim 2, wherein the circuit case is attached to the connection bracket at a front side of the connection bracket by the fastening member.

4. The display apparatus of claim 3, wherein the circuit case is separable from the front side of the cabinet by detaching the connection bracket from the circuit case at the front side of the cabinet.

5. The display apparatus of claim 3, wherein the circuit case is separable from the rear side of the cabinet by detaching the connection bracket from the cabinet at the rear side of the cabinet.

6. The display apparatus of claim 1, wherein the first case further comprises a first hinge bracket comprising a shaft protrusion, and
   wherein the first hinge bracket is attached to a first side surface of the first case.

7. The display apparatus of claim 6, wherein the second case comprises a second hinge bracket comprising a shaft hole,
   wherein the shaft protrusion is inserted into the shaft hole, and
   wherein the second hinge bracket is attached to a second side surface of the second case.

8. The display apparatus of claim 7, wherein the second case is rotatably connected to the first case.

9. The display apparatus of claim 6, wherein the second case comprises a second hinge bracket comprising a shaft hole, wherein the second hinge bracket is attached to a side surface of the second case, and wherein the second case is separated from the first case by the shaft protrusion that is separated from the shaft hole.

10. The display apparatus of claim 1, wherein the circuit case further comprises a case sealing member provided along a side edge of the first case, and wherein the case sealing member is provided to seal a region between the first case and the second case.

11. The display apparatus of claim 1, further comprising a plurality of display modules, and wherein the cabinet is provided to support the plurality of display modules.

12. The display apparatus of claim 1, wherein the cabinet is included in a plurality of cabinets, and wherein the plurality of cabinets are provided to be connected to each other in a horizontal direction and a vertical direction.

* * * * *